United States Patent [19]

Vittoz

[11] 4,013,979
[45] Mar. 22, 1977

[54] CMOS OSCILLATOR WITH FIRST AND SECOND MOS TRANSISTORS OF OPPOSED TYPE INTEGRATED ON THE SAME SUBSTRATE

[75] Inventor: Eric Vittoz, Cernier, Switzerland

[73] Assignee: Centre Electronique Horloger S.A., Neuchatel, Switzerland

[22] Filed: Sept. 22, 1975

[21] Appl. No.: 615,709

[30] Foreign Application Priority Data

Sept. 20, 1974 Switzerland ............... 12789/74

[52] U.S. Cl. .................. 331/108 B; 58/23 A; 331/108 D; 331/116 R
[51] Int. Cl.² .................. H03B 5/24; H03B 5/36
[58] Field of Search ....... 331/116 R, 108 A, 108 B, 331/108 C, 108 D, 117 R; 58/23 R, 23 A, 23 AC

[56] References Cited
UNITED STATES PATENTS 3,887,881  6/1975  Hoffmann .................. 331/116 R X Primary Examiner—Siegfried H. Grimm
Attorney, Agent, or Firm—Young & Thompson

[57] ABSTRACT

CMOS oscillator in which the oscillator circuit comprises a first MOS transistor connected by its source to a first terminal of a voltage supply and biased by the current provided by a second MOS transistor of opposed type which is a part of the same integrated circuit. At least a third MOS transistor ($T_6$, $T_8$, $T_{12}$) of the same type as the second and which is a part of the same integrated circuit is provided, the sources and gates of the second and third transistors being respectively connected together and respectively to the second terminal of the voltage supply and to a point (P) at a potential such that the mean drain current of the first transistor will be maintained at a value just higher than the value at which oscillation starts.

13 Claims, 10 Drawing Figures

CMOS OSCILLATOR WITH FIRST AND SECOND MOS TRANSISTORS OF OPPOSED TYPE INTEGRATED ON THE SAME SUBSTRATE

The present invention relates to oscillators employing CMOS technology, in which the oscillator circuit comprises a first MOS transistor which is biased by the current provided by a second MOS transistor of opposite type which is part of the same integrated circuit.

It is known how to design oscillators of low power consumption, for example quartz oscillators, in CMOS technology, that is, in the form of integrated circuits with complementary MOS transistors (Electronics Letters, Vol. 9, No. 19, Sept. 20, 1973, pp. 451–453). This known arrangement uses as bias current source of the first transistor of the oscillator circuit a complementary transistor whose gate is connected to the same terminal of the supply as the source of the first transistor and whose source is connected to the other terminal of the supply. In this case, the mean drain current of the first transistor is quite dependent on the threshold voltage of the second transistor as well as on the supply voltage.

Also, if a CMOS inverter is used the input and output of which are connected through the quartz resonator, there results an oscillation of large amplitude and a current consumption very much higher than the minimum necessary to sustain oscillation in a "Pierce" circuit.

It has also been proposed, in published Swiss application No. 15126/68, to control automatically the current consumed by the oscillator by directly detecting the amplitude of the oscillation signal. This known solution also involves a large oscillation amplitude. On the other hand, the corresponding circuit, which is designed for transistors of a single type, presents a number of drawbacks: the output conductance of the transistor of the oscillator circuit is high because of the phenomenon of modulation by the substrate, which increases the needed current; the circuit comprises a capacitative connection which gives rise to certain difficulties in integration; the ground of the circuit is connected to one of the quartz terminals, which results in the parasitic capacitances between the other terminal and ground adding to the undesired capacitance which appears in parallel across the quartz instead of adding to the functinal capacitances between drain and source and between gate and source of the transistor of the oscillator circuit; this can make the oscillator very critical when the quality factor of the quartz is low.

Accordingly, it is an object of the present invention to provide an integrated oscillator, and particularly a quartz oscillator having minimum current consumption and operating in a stable and precise manner.

To this end, the oscillator according to the present invention in which the oscillator circuit comprises a first MOS transistor connected by its source to a first terminal of a voltage supply and biased by the current provided by a second MOS transistor of opposed type which is a part of the same integrated circuit, comprises at least a third MOS transistor of the same channel type as the second and which is part of the same integrated circuit, the source and gate electrodes of the second and third transistors being connected together and respectively to the second terminal of the voltage supply and to a point having a potential such that the mean drain current of the first transistor will be maintained at a value only just higher than the value at which oscillation starts.

An embodiment of the oscillator according to the present invention provides for the amplification of the oscillation signal in a manner which is both simple and completely compatible with integrated CMOS circuit technology. This embodiment is characterized in that the oscillator comprises a pair of MOS transistors of opposite channel types which are part of the same integrated circuit and which are so dimensioned that the width-length ratio of the channel of each relative to the corresponding dimensions of the channel of the transistor of the same type among the first and second transistors, will be equal, the gate and source electrodes of the transistors of the said pair being connected respectively to those of the first and second transistors and the common connection point of the drains of the said pair of transistors constituting the output of the oscillator.

Other embodiments of the oscillator according to the invention provide very high precision and stability in the maintenance of the mean drain current of the first transistor. To this end, the mean drain current may be imposed on the first transistor by means of a control loop.

Other objects, features and advantages of the present invention will become apparent from a consideration of the following description, taken in connection with the accompanying drawings, in which.

Figure 1:
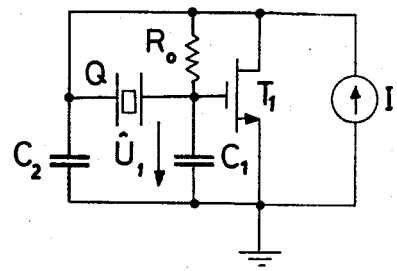
FIG. 1 is a diagram of a "Pierce" circuit such as may be used in the oscillator of the present invention.

Referring now to the drawings in greater detail, and first to FIG. 1 thereof, there is shown a known quartz oscillator circuit, known as a "Pierce" circuit, embodying a single MOS transistor $T_1$. Transistor $T_1$ is biased to active state by a resistance $R_0$ connected between drain and gate, so that the mean potential of the gate is equal to that of the drain, the transistor being fed by a current source I which establishes the mean drain current. A quartz resonator Q is connected between drain and gate of the transistor. The diagram also shows two capacitances $C_1$ and $C_2$ disposed respectively between gate and source and between drain and source of transistor $T_1$. These two capacitances, which are necessary to the operation of the oscillator, may be components connected between the illustrated points, or alternatively may be constituted solely by the parasitic capacitances of $T_1$.

The principal advantage of this circuit with a single transistor is the very small influence of the non-linear effects on the oscillation frequency. This advantage is especially desirable at relatively high frequencies for which other circuits can no longer be used because their oscillation frequency becomes too dependent on certain parameters such as temperature and supply voltage.

Figure 2:
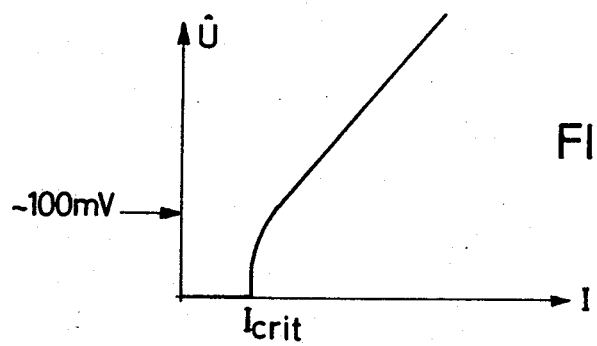
FIG. 2 is a graph showing the variation of the oscillation amplitude in the circuit of FIG. 1 as a function of the supply current.

FIG. 2 shows the variation of oscillation amplitude of the circuit of FIG. 1, represented for example by the amplitude $U_1$ of the voltage across $C_1$, as a function of the biasing current I. The relationship represented quantitatively in this graph shows that no oscillation exists when the biasing current I is lower than the critical value $I_{crit}$. When I exceeds $I_{crit}$, oscillation rises sharply to an amplitude of the order of about 100 mV. Beyond that amplitude, the nonlinearity of the gate voltage versus drain current characteristic of the transistor begins to have an effect and the amplitude of the oscillation can be increased only at the price of increased current I.

Figure 3:
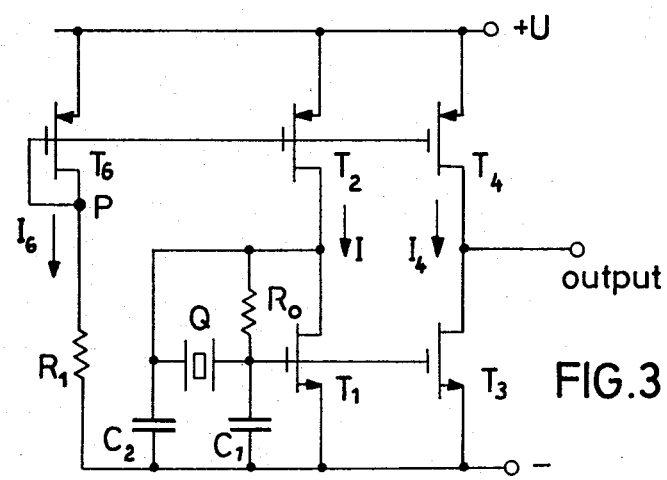
FIG. 3 is a circuit diagram of a first embodiment of an oscillator with signal amplification.

FIG. 3 shows a circuit diagram of a first embodiment of the present oscillator, utilizing means to adjust the current I to a value only slightly greater than $I_{crit}$ and comprising on the other hand an amplifier circuit so as to impart to the oscillation signal an amplitude permitting control of logic circuits that can be connected to the oscillator.

The oscillator of FIG. 3 comprises the oscillator circuit of FIG. 1, the source of bias current comprising a complementary MOS transistor $T_2$ whose source is connected to a terminal of the voltage supply the other terminal of which is connected to the source of transistor $T_1$. The gate of transistor $T_2$ is connected to the gate of a third transistor $T_6$ of the same channel type as transistor $T_2$, the source of this transistor $T_6$ being connected to the same supply terminal as the transistor $T_2$ and its drain being connected on the one hand to the gates of $T_2$ and $T_6$ (P), and on the other hand, by means of a resistance $R_1$, to the other terminal of the voltage supply.

The diagram of FIG. 3, further comprises a pair of complementary MOS transistors $T_3$ and $T_4$ of the same types, respectively, as the transistors $T_1$ and $T_2$, the gates and sources of these transistors $T_2$ and $T_4$ on the one hand and of the transistors $T_1$ and $T_3$ on the other hand, being directly connected to each other. The common point of connection of the drains of the transistors $T_3$ and $T_4$ constitutes the output of the oscillator.

Figure 4:
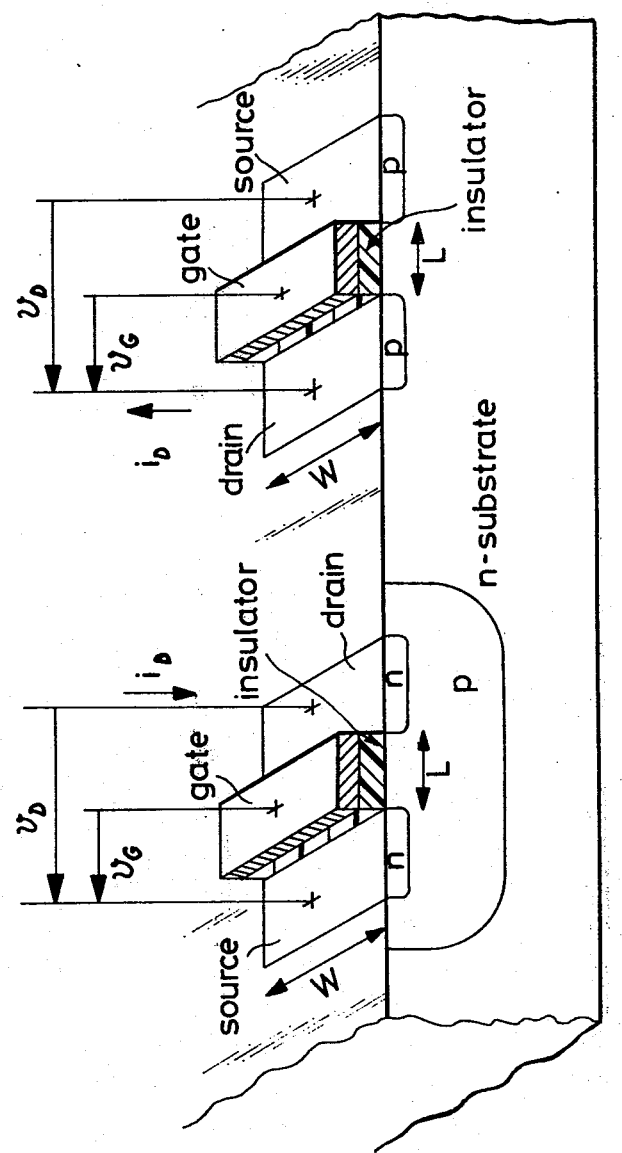
FIG. 4 is a schematic view of two MOS transistors of opposite types which are part of the same integrated circuit.

The dimensioning of the elements of the present oscillator and the operation of the circuit of FIG. 3 are explained on the basis of the definitions given in connection with the schematic showing of FIG. 4.

FIG. 4 is a schematic view of two MOS transistors of opposed type which are embodied in the same integrated circuit (CMOS technology). The different transistors of the same channel type, that is p-channel type of n-channel type, which are part of the same integrated circuit differ only by the width W and the length L of their respective channels shown in FIG. 4.

The drain current $i_D$ of the MOS transistor follows a law corresponding to the expression $$i_D = (W/L)\ F\ (v_G, v_D)$$

in which $v_G$ and $v_D$ are respectively the gate-to-source and drain-to-source voltages of the transistor. The function F depends on the mode of operation of the transistor. It can vary considerably from one manufactured lot of transistors to another, but experience shows that it is substantially the same for all the transistors of the same channel type which are part of the same integrated circuit. Moreover, this function becomes independent of $v_D$, as a first approximation, if the transistor operates in the saturation region which is reached when $$v_D > v_G - V_T$$

in which $V_T$ is the threshold voltage of the transistor.

Under these circumstances, the drain currents of several transistors $T_i$ of the same channel type and being part of the same integrated circuit are proportional to their respective dimensional ratios $a_i = W_i/L_i$. It is on this principle that the concept of the present oscillator is based.

In the diagram of FIG. 3, the n-channel transistors $T_1$ and $T_3$ differ from each other only as to their dimensional ratios $a_1$ and $a_3$, and the p-channel transistors $T_2$, $T_3$ and $T_6$ differ from each other only as to their corresponding ratios $a_2$, $a_4$ and $a_6$. Thus, according to the above-mentioned principle, the bias current I of $T_1$, which is equal to the drain current of transistor $T_2$, is given by the expression $$I = I_6 \cdot a_2/a_6$$

The drain current of $T_6$, denominated $I_6$, is given by the expression $$I_6 = (U - V_{G6}/R_1)$$

in which $V_{G6}$ is the gate voltage of $T_6$. This gate voltage being close to the threshold voltage of the p-channel transistors which is much lower than the supply voltage U, the current $I_6$ is substantially a function of U and of $R_1$. In other words, the potential of point P applied to the gate of transistor $T_2$ can be determined by these two parameters such that the current I will have a value only just greater than the value $I_{crit}$ indicated in FIG. 2.

On the other hand, in the diagram of FIG. 3, the transistors $T_1$, $T_2$, $T_3$ and $T_4$ are so dimensioned that $$a_3/a_1 = a_4/a_2$$

Transistor $T_1$ being biased in the active state by the presence of resistance $R_o$, transistor $T_3$ is similarly biased in the active state with a quiescent current $$I_4 = I \cdot a_4/a_2$$

The transistor pair $T_3$, $T_4$ constitutes an amplification stage. The oscillation signal from the gate of $T_1$ is applied directly to the gate of the amplifier transistor $T_3$ which provides at its drain an output signal of great amplitude.

Figure 5:
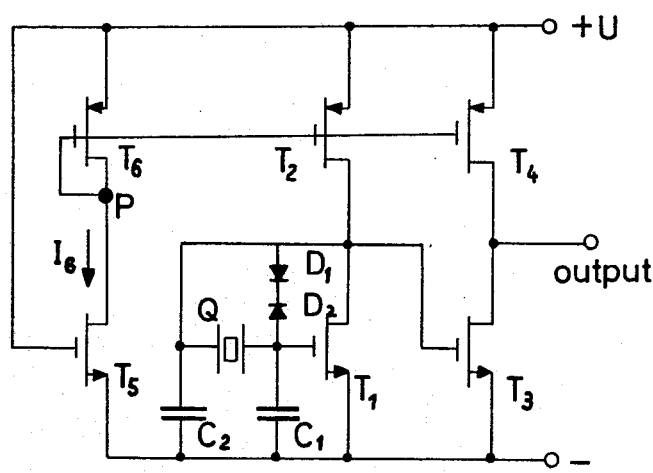
FIG. 5 is a circuit diagram of a modification of the oscillator shown in FIG. 3.

FIG. 5 is a diagram of an embodiment showing different variations, independent from each other, which may be made in the arrangement of FIG. 3. Thus, in FIG. 5, the resistance $R_1$ is replaced by a transistor $T_5$ whose gate-to-source voltage is equal to the supply voltage U. On the other hand, the biasing resistance $R_o$ is replaced by two diodes $D_1$ and $D_2$ connected in series and in opposition. These diodes may be provided for example by lateral junctions in polycrystalline silicon used as the gate electrodes. These two modifications completely eliminate the resistors whose manufacture can give rise to problems in CMOS technology.

Furthermore, in FIG. 5, the gate of transistor $T_3$ is no longer connected to the gate but rather to the drain of $T_1$, whose mean potential is identical to that of the gate of $T_1$.

Figure 6:
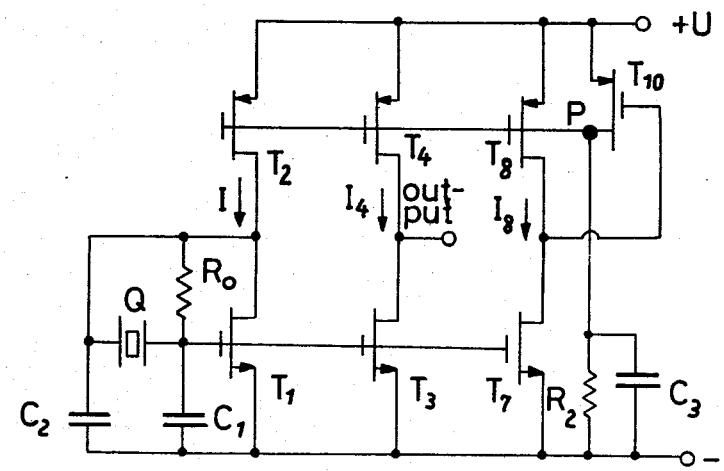
FIG. 6 is a circuit diagram of an embodiment of oscillator comprising a control loop and making use of a control transistor.

FIG. 6 shows another preferred embodiment of the present oscillator. The basic oscillator circuit comprising $T_1$ and the mounting of the transistors $T_2$, $T_3$ and $T_4$ as well as the dimensioning of the same are similar to those of FIG. 3.

A third pair of complementary transistors $T_7$ and $T_8$ is connected in the same fashion as the pair $T_3$ and $T_4$, the common connection point of the drains of $T_7$ and $T_8$, constituting the output of this stage, being connected to the gate of a p-channel control transistor $T_{10}$. The source of transistor $T_{10}$ is connected to the positive terminal of the power supply and its drain circuit comprises a load resistance $R_2$ shunted by a capacitor $C_3$. The drain of transistor $T_{10}$ which is the output of this stage constitutes the point P connected directly to the gates of $T_2$, $T_4$ and $T_8$.

The transistor pair $T_7$ and $T_8$ is dimensioned such that $$a_8/a_2 > a_7/a_1$$

It follows that, in the absence of oscillation, the drain currents of $T_1$ and $T_2$ being equal, the saturation current of $T_8$ is greater than that of $T_7$. The common potential of the drains of $T_7$ and $T_8$ is thus close to the positive supply potential +U, such that the quiescent operating point of $T_8$ departs from the saturation region, which reduces the drain current thereof. Transistor $T_{10}$ is accordingly turned off and resistance $R_2$ brings the gate potential of transistors $T_2$, $T_4$ and $T_8$ to that of the negative supply terminal. The currents I, $I_4$ and $I_8$ then take a higher value and the oscillation starts.

When the oscillation amplitude has attained a sufficient value, the positive voltage peaks at the gate of $T_7$ lead to an increase of the drain current of $T_7$ until the same overcomes that of $T_8$, despite the initial dissymmetry. Negative pulses appear then on the gate of $T_{10}$. The mean drain current of this transistor is thus no longer zero and gives rise to a d.c. voltage across $R_2$. The potential at point P rises and currents I, $I_4$ and $I_8$ decrease to the level just adequate to permit a periodic conduction of control transistor $T_{10}$. The operating current I is thus stabilized by the feed back loop including the transistor $T_{10}$.

Figure 7:
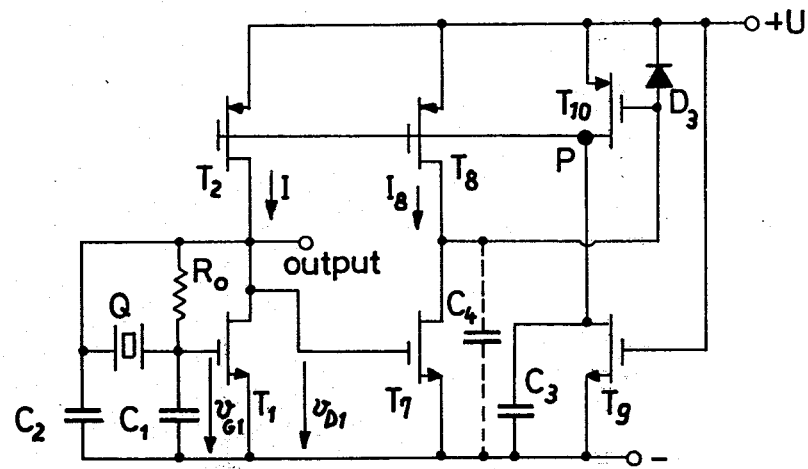
FIG. 7 is a circuit diagram of a modification of the oscillator of FIG. 6.

FIG. 7 shows a number of variations which can be embodied in the circuit of FIG. 6 and which are independent of each other. A diode $D_3$ is connected in blocking direction between source and gate of $T_{10}$. The leakage current of $D_3$ is greater than that of the p-n junction drain/substrate of transistor $T_7$, so that the potential of the gate of $T_{10}$ will be about +U, even if no current flows through the channel of the transistor. This diode can be formed for example by a lateral p-n junction of polycrystalline silicon. It may also be replaced by a high ohmic resistance.

The output signal of the oscillator is taken directly from the drain of $T_1$ and is applied in parallel to the gate of transistor $T_7$, the mean potential of the gate and of the drain of $T_1$ being of the same magnitude. Resistance $R_2$ in FIG. 6 is replaced by a transistor $T_9$ with long n-channel, whose gate is connected to +U.

The capacitance $C_4$ shown in phantom lines is a parasitic capacitance for the described mode of operation, because it limits the gain of amplifier $T_7$, $T_8$. However, the control means operates even if this capacitance is very great, the mode of operation being then as follows: when the oscillation amplitude at the gate of $T_1$ exceeds several hundred mV, the operating point of $T_1$ leaves the saturation region during the positive half-waves of the gate voltage, which tends to lower the mean value of the drain current of $T_1$. As this value should remain equal to the constant current I supplied by $T_2$, this lowering is compensated by an increase of mean potential at the gate and at the drain of $T_1$, this potential being also that of the gate of $T_7$. The mean drain current of $T_7$ increases therefore and ultimately surpasses that of $T_8$, reducing the mean potential of the gate of $T_{10}$. Transistor $T_{10}$ thus becomes conductive causing a reduction in currents I and $I_8$ supplied by $T_2$ and $T_8$ to a level just sufficient to maintain $T_{10}$ conductive.

Figure 8:
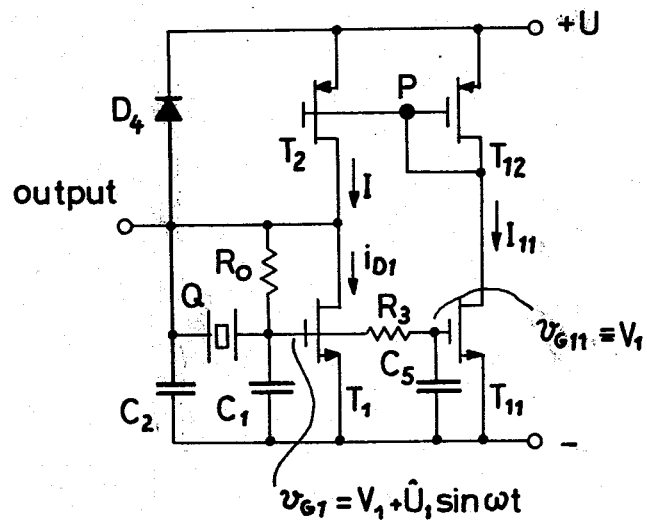
FIG. 8 is a circuit diagram of another embodiment of the oscillator according to the invention.

FIG. 8 shows another embodiment of the present oscillator, by which the amplitude of oscillation can be limited to a very low value without amplifying the signal. The oscillator circuit comprising transistor $T_1$ is identical to the preceding examples, as well as the operation of transistor $T_2$. A pair of complementary transistors $T_{11}$ and $T_{12}$ having a common node at their drains is connected by the sources to the corresponding terminals of the voltage supply. The gate of the p-channel transistor $T_{12}$ is connected to the drain thereof and to the gate of transistor $T_2$ (point P). The gate of the n-channel of transistor $T_{11}$ is connected to the gate of transistor $T_1$ by means of resistance $R_3$, a capacitance $C_5$ being connected in parallel between gate and source of the transistor $T_{11}$. The resistance $R_3$ and capacitance $C_5$ constitute a low pass filter.

The four transistors of the circuit of FIG. 8 are so dimensioned that $$a_{12}/a_2 < a_{11}/a_1$$

In the absence of oscillation and if the four transistors were operating in the saturation region, the current I resulting from a given current $i_{D1}$ would be equal to $ki_{D1}$ with $$k = a_2/a_{12} \cdot a_{11}/a_1 > 1$$

There is accordingly no quiescent operating point corresponding to these conditions. The currents increase until at least one of the transistors $T_2$ and $T_{11}$ leaves the saturation region such that $i_{D1} = I$.

Current I is then largely sufficient to start oscillation. When the amplitude of oscillation $Û_1$ at the gate of $T_1$ increases, the mean gate voltage $V_1$ decreases due to the nonlinear characteristic $i_{D1} = f(v_{G1})$ to maintain the average of $i_{D1} = I$. The gate voltage $v_{G11}$ of $T_{11}$ is equal to $V_1$, as the a.c. component does not appear at the output of filter $R_3$, $C_5$, and therefore the current $I_{11}$ decreases, causing a decrease of the current I. The circuit stabilizes at a value I which is necessary to sustain an oscillation of an amplitude $Û_1$ sufficient to compensate the factor k greater than 1, and the four transistors operate about a quiescent operating point located in the saturation region.

Figure 9:
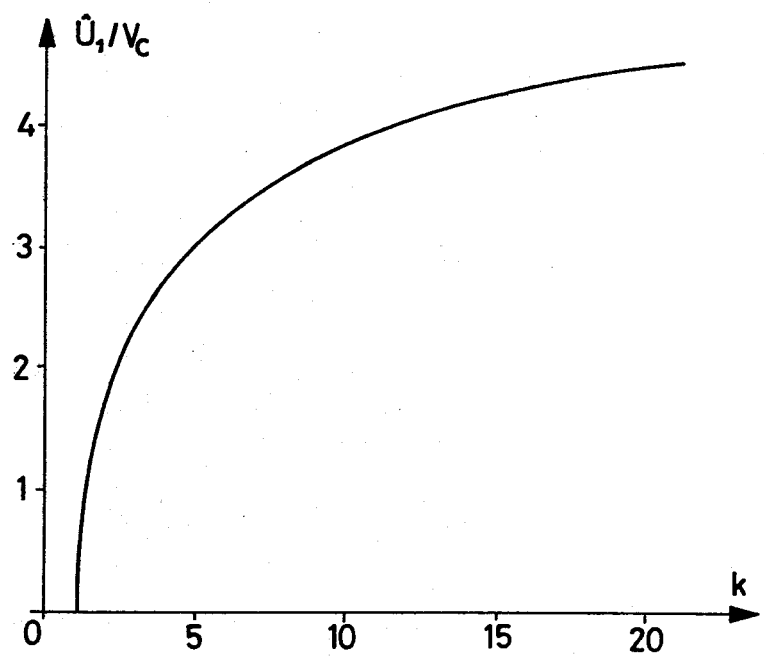
FIG. 9 is a graph showing the variation of the amplitude of oscillation of the oscillator of FIG. 8 as a function of the dimensions of the transistors which are utilized.

The values of $a_1$ and $a_{11}$ are preferably sufficiently large that the transistors $T_1$ and $T_{11}$ operate at a low current density. In this case, it will be seen that the stabilized amplitude $$\hat{U}_1/V_c$$

depends only on the ratio $k$ according to the relationship shown in FIG. 9. $V_c$ is a generally well controlled constant for a given technology. This embodiment of the oscillator therefore permits stabilizing the consumed current by the choice of the dimensional ratios of the four transistors that are used.

A diode $D_4$ may be connected between source and drain of transistor $T_4$ to overcome the drain-to-substrate leakage current of the transistor $T_1$ and to permit the quiescent operating point to establish itself accurately when the supply voltage is switched on. This diode may be of the same type as diode $D_3$ in FIG. 7.

On the other hand, resistances $R_0$ and $R_3$ might be replaced by pairs of diodes connected in series in opposed direction.

The oscillator circuit of the "Pierce" type used in the embodiments described above might be replaced for example by a phase-shift oscillator circuit.

Figure 10:
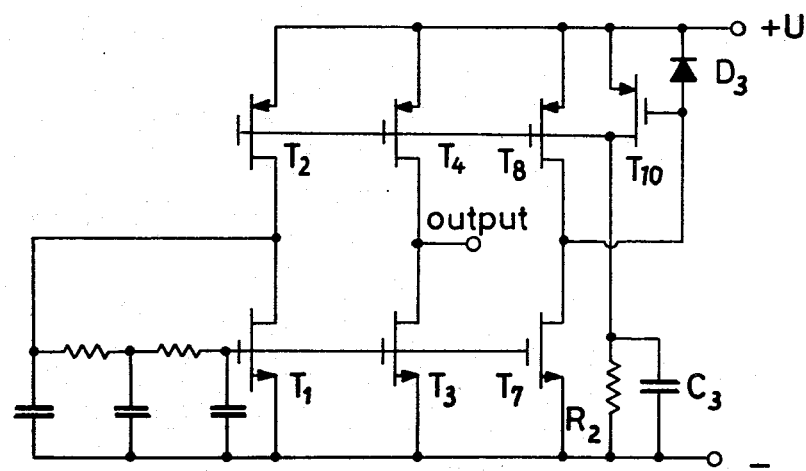
FIG. 10 is a circuit diagram of an embodiment utilizing a phase-shift oscillator circuit.

FIG. 10 shows an embodiment which utilizes a resistance-capacitance oscillator circuit and in which the control circuit and the amplifier circuit operate like those of FIG. 6. The number of meshes of the RC network may be greater than shown in FIG. 10 and a distributed network or other form of network can be used without departing from the principle of the present oscillator.

In all the different embodiments of the invention, it is possible to reduce the current consumption of the oscillator to a minimum level, which also limits the amplitude of the oscillation signal at the gate of the first transistor and thus avoids the non-linear effects which would have a great influence on the oscillation frequency.

From a consideration of the foregoing disclosure therefore, it will be evident that the initially recited objects of the present invention have been achieved.

Although the present invention has been described and illustrated in connection with preferred embodiments, it is to be understood that modifications and variations may be resorted to without departing from the spirit of the invention, as those skilled in this art will readily understand. Such modifications and variations are considered to be within the purview and scope of the present invention as defined by the appended claims.

What is claimed is:

1. A CMOS oscillator in which the oscillator circuit comprises a first and a second MOS transistor of opposed type integrated on the same substrate, the source-drain path of the first transistor being connected in series with the drain-source path of the second transistor between the terminals of a voltage supply and the drain and gate of the first transistor being coupled to each other through a frequency determining network, and at least a third MOS transistor ($T_6$, $T_8$, $T_{12}$) of the same channel type as the second transistor, integrated on the same substrate, the sources of the said second and third transistors being connected together to one terminal of the voltage supply and the gates thereof being connected together to a point (P) at a potential such that the mean drain current of the first transistor is maintained at a value just higher than the value at which oscillation starts.

2. An oscillator as claimed in claim 1, in which the drain of the third transistor ($T_6$) is connected on the one hand to the gate of the same and, on the other hand, by means of a resistance ($R_1$) to the first terminal of the voltage supply.

3. An oscillator as claimed in claim 1, comprising a pair of complementary MOS transistors comprising said third transistor ($T_6$) and a fourth transistor ($T_5$) of the same channel type as the first and having a common node at their drains, the gate of the third transistor ($T_6$) being connected to this common connection point of the drains and the gate of the fourth transistor being connected to the second terminal of the voltage supply, the source of this fourth transistor being connected to the first terminal of this voltage supply.

4. An oscillator as claimed in claim 1, comprising a pair of MOS transistors of opposed type ($T_3$, $T_4$) which are part of the same integrated circuit and which are so dimensioned that the quotients of the ratio width/length of the channel of each of them by the corresponding dimensional ratio of the channel of the transistor of the same type of the first and second transistors, will be equal, the source and gate electrodes of the transistors of said pair being connected respectively to those of the first and second transistors and the common connection point of the drains of said pair of transistors constituting the output of the oscillator.

5. An oscillator as claimed in claim 1, comprising a pair of MOS transistors of opposed type ($T_3$, $T_4$) which are part of the same integrated circuit and which are so dimensioned that the quotients of the ratio width/length of the channel of each of them by the corresponding dimensional ratio of the channel of the transistor of the same type of the first and second transistors, will be equal, the sources of the transistors of said pair being connected respectively to those of the first and second transistors, the gate of the transistor ($T_4$) of the same channel type as the second being connected to that of the latter, the gate of the transistor of the same channel type as the first being connected to the drain of this latter and the common connection point of the drains of said pair of transistors constituting the output of the oscillator.

6. An oscillator as claimed in claim 1, comprising a pair of complementary MOS transistors comprising the third transistor ($T_8$) and a fourth transistor ($T_7$) of the same channel type as the first and having a common node at the drains, these two transistors being so dimensioned that the quotient of the ratio width/length of the channel of the third transistor by the corresponding ratio of the second transistor will be greater than the quotient of the ratio width/length of the channel of the fourth transistor by the corresponding ratio of the first transistor, the source and gate electrodes of the fourth transistor being connected respectively to those of the first transistor, and further comprising a control transistor ($T_{10}$) of the same channel type as the second transistor, the source of the control transistor being connected to the second terminal of the voltage supply, the gate of this transistor being connected to the common connection point of the drains of the third and fourth transistors and the drain of the control transistor being connected on the one hand to the gate of the second transistor and on the other hand by means of a resistance ($R_2$) shunted by a capacitance ($C_3$) to the first terminal of the voltage supply.

7. An oscillator as claimed in claim 1, comprising a pair of complementary MOS transistors comprising the third transistor ($T_8$) and a fourth transistor ($T_7$) of the same channel type as the first and having a common node at the drains, these two transistors being so dimensioned that the quotient of the ratio width/length of the channel of the third transistor by the corresponding ratio of the second transistor will be greater than the quotient of the ratio width/length of the channel of the fourth transistor by the corresponding ratio of the first transistor, the source and gate electrodes of the fourth transistor being connected respectively to those of the first transistor, and further comprising a control transistor ($T_{10}$) of the same channel type as the second transistor, the source of the control transistor being connected to the second terminal of the voltage supply, the gate of this transistor being connected to the common connection point of the drains of the third and fourth transistors and the drain of the control transistor being connected on the one hand to the gate of the second transistor and on the other hand by means of a transistor ($T_9$) with a long channel of the same type as that of the first transistor, whose gate, source and drain are connected respectively to the second and first terminals of the voltage supply and to the drain of the control transistor, said long channel transistor being shunted by a capacitance ($C_3$) to the first terminal of the voltage supply.

8. An oscillator as claimed in claim 6, comprising a diode ($D_3$) connected in blocking direction between the source and the gate of the control transistor ($T_{10}$).

9. An oscillator as claimed in claim 1, comprising a pair of complementary MOS transistors comprising a third transistor ($T_{12}$) of the same channel type as the first and a fourth transistor ($T_{11}$) of the same channel type as the first and having a common node at their drains, these two transistors being so dimensioned that the quotient of the ratio width/length of the channel of the third transistor by the corresponding ratio of the second transistor will be smaller than the quotient of the ratio width/length of the channel of the fourth transistor by the corresponding ratio of the first transistor, the gate of the third transistor being connected to the drain of the same and the gates and sources of the first and fourth transistors being connected by means of a low pass filter ($R_3$, $C_5$).

10. An oscillator as claimed in claim 9, in which the low pass filter is constituted by two diodes connected in series, in an opposed sense, between the gates of the first and fourth transistors, and by a capacitance connected between the gate of the fourth transistor and the common connection point of the sources of the first and fourth transistors.

11. An oscillator as claimed in claim 1, comprising a quartz resonator connected between the drain and the gate of the first transistor, in parallel to a biasing resistance ($R_o$), and capacitances ($C_1$, $C_2$) between drain and source and between gate and source of this transistor.

12. An oscillator as claimed in claim 11, in which the biasing resistance is replaced by two diodes connected in series in opposed direction.

13. An oscillator as claimed in claim 1, in which the oscillator circuit comprises a resistance-capacitance network which determines the oscillation frequency.

* * * * *